(12) United States Patent
Lin et al.

(10) Patent No.: US 9,383,841 B2
(45) Date of Patent: Jul. 5, 2016

(54) SHIFT REGISTER CIRCUIT

(71) Applicant: AU Optronics Corp., Hsin-Chu (TW)

(72) Inventors: Wei-Li Lin, Hsin-Chu (TW); Che-Wei Tung, Hsin-Chu (TW); Chia-Heng Chen, Hsin-Chu (TW); Shu-Fang Hou, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 109 days.

(21) Appl. No.: 14/287,305

(22) Filed: May 27, 2014

(65) Prior Publication Data

US 2014/0355732 A1 Dec. 4, 2014

(30) Foreign Application Priority Data

May 28, 2013 (TW) .............................. 102118837 A

(51) Int. Cl.
*G11C 19/00* (2006.01)
*G06F 3/041* (2006.01)
*G11C 19/28* (2006.01)

(52) U.S. Cl.
CPC ................ *G06F 3/041* (2013.01); *G11C 19/28* (2013.01); *G09G 2310/0286* (2013.01)

(58) Field of Classification Search
None
See application file for complete search history.

(56) References Cited

U.S. PATENT DOCUMENTS

| 7,688,934 | B2* | 3/2010 | Tsai | ....................... | G11C 19/28 377/64 |
| 8,396,183 | B2* | 3/2013 | Yang | ....................... | G09G 3/20 377/64 |
| 8,515,000 | B2* | 8/2013 | Yang | ....................... | G11C 19/28 377/64 |
| 8,537,094 | B2* | 9/2013 | Yang | ................... | G09G 3/3677 345/100 |
| 8,971,479 | B2* | 3/2015 | Chang | ................... | G09G 3/3655 377/64 |
| 2009/0304138 | A1* | 12/2009 | Tsai | ....................... | G11C 19/28 377/79 |
| 2011/0044423 | A1* | 2/2011 | Lin | ......................... | G09G 3/32 377/64 |
| 2014/0369457 | A1* | 12/2014 | Lin | ....................... | G11C 19/28 377/64 |
| 2015/0049853 | A1* | 2/2015 | Lin | ....................... | G11C 19/28 377/64 |

* cited by examiner

*Primary Examiner* — Tuan T Lam
(74) *Attorney, Agent, or Firm* — McClure, Qualey & Rodack, LLP

(57) ABSTRACT

A shift register is disclosed. The shift register circuit includes a pull up control circuit configured to provide a pull up control signal; a first pull up circuit configured to provide a sensor driving signal in response to the pull up control signal and a second clock signal; a second pull up circuit configured to provide a gate driving signal in response to a first clock signal, the pull up control signal and the second clock signal; a first pull down control circuit configured to output a first pull down control signal; a first pull down circuit configured to pull down the pull up control signal, the sensor driving signal and the gate driving signal in response to the first pull down control signal; and a main pull down circuit configured to pull down the pull up control signal and the gate driving signal.

10 Claims, 6 Drawing Sheets

SHIFT REGISTER CIRCUIT

CROSS-REFERENCE TO RELATED APPLICATIONS

This non-provisional application claims priority under 35 U.S.C. §119(a) on Taiwanese Patent Application No. 102118837 filed in Taiwan, R.O.C. on May 28, 2013, the entire contents of which are hereby incorporated by reference.

1. Technical Field

The present invention is directed to a shift register circuit, and more particularly, to a shift register applicable in a touch display device.

2. Background

As the technological advancement in the display panel industry becomes more demanding on display quality, it also moves towards reducing the size of panels. It is also desirable that the manufacturing cost can be as low as possible while achieving the same functionality in the product. Technology constantly evolves to meet these needs. To generate gate pulse signals and data pulse signals, the industry typically employs external driver integrated circuits, which are an extra step in the production process and a waste of resources. An engineering bypass would be incorporating, during manufacture, the shift register of the gate driver integrated circuit straight onto the glass panel, a technique often known as gate-driver-on-array (GOA).

Recently, various electronic devices have adopted touch panels instead of conventional keyboards or mice as their input devices. A user can read or input data simply by touching a display screen of such electronic device with their finger.

However, conventional shift register of the gate driver integrated circuit straight onto the glass panel can not generate driving signals that fulfill both the need of display function and touch function.

SUMMARY

In accordance with one embodiment, a shift register circuit is disclosed. The shift register circuit includes a pull up control circuit configured to provide a pull up control signal; a first pull up circuit configured to provide a sensor driving signal in response to the pull up control signal and a second clock signal; a second pull up circuit configured to provide a gate driving signal in response to a first clock signal, the pull up control signal and the second clock signal; a first pull down control circuit configured to output a first pull down control signal; a first pull down circuit configured to pull down the pull up control signal, the sensor driving signal and the gate driving signal in response to the first pull down control signal; and a main pull down circuit configured to pull down the pull up control signal and the gate driving signal.

BRIEF DESCRIPTION OF THE DRAWINGS

The present disclosure will become more fully understood from the detailed description given herein below for illustration only and thus does not limit the present disclosure, wherein.

DETAILED DESCRIPTION

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, circuits, and networks have not been described in detail so as not to unnecessarily obscure aspects of the embodiments.

Figure 1:
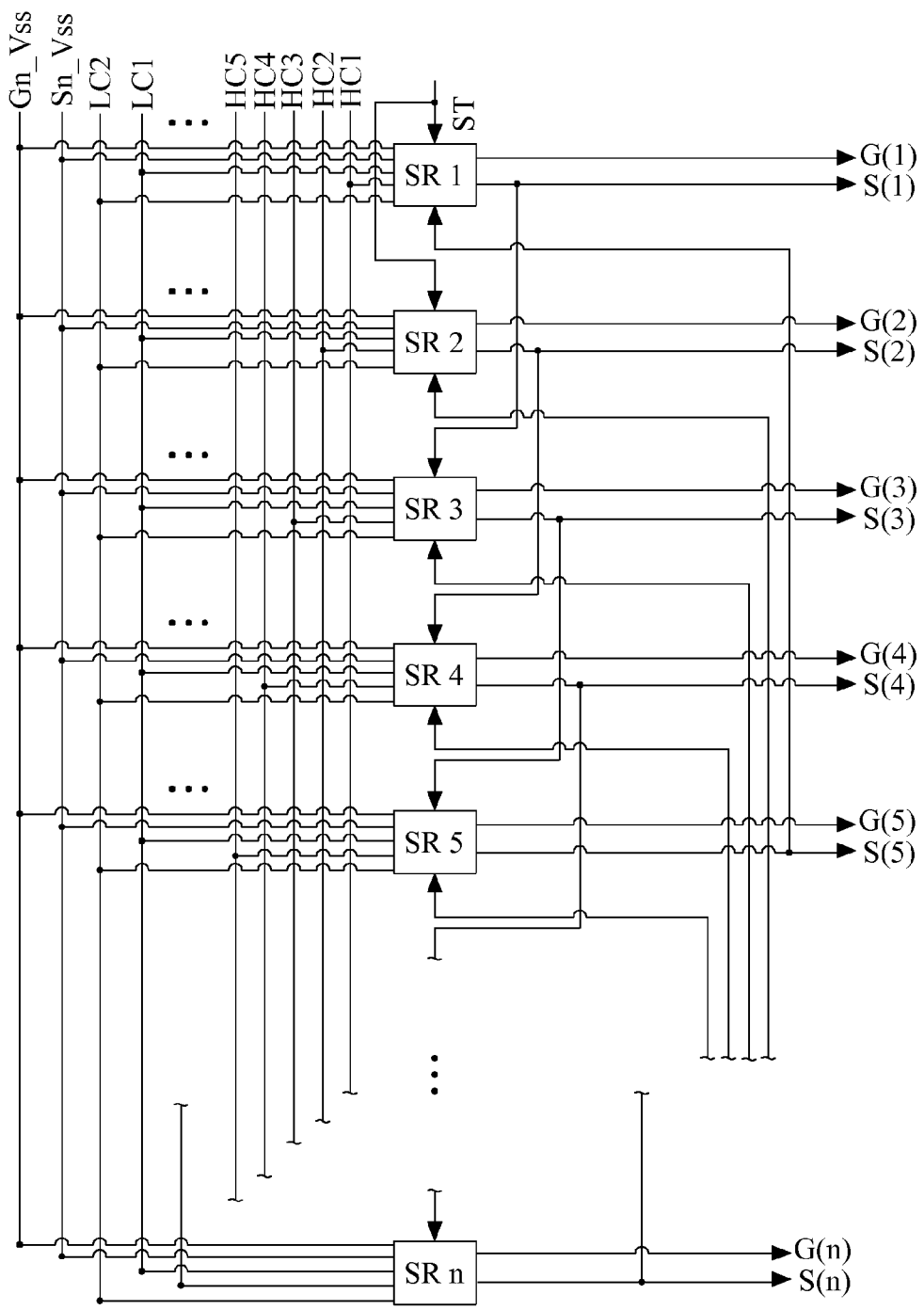
FIG. 1 is a block diagram illustrating a shift register in accordance with one embodiment.

Please refer to FIG. 1, which is a block diagram illustrating a shift register in accordance with one embodiment. The shift register comprises a plurality of series-connected shift register circuits SR1~SRn are configured to output gate driving signals G(n) and sensor driving signals S(n) in accordance with clock signals HC1, HC2, HC3, HC4, HC5, HC6, low frequency signals LC1 and LC2, and low voltage level signals Gn_Vss and Sn_Vss.

Figure 2:
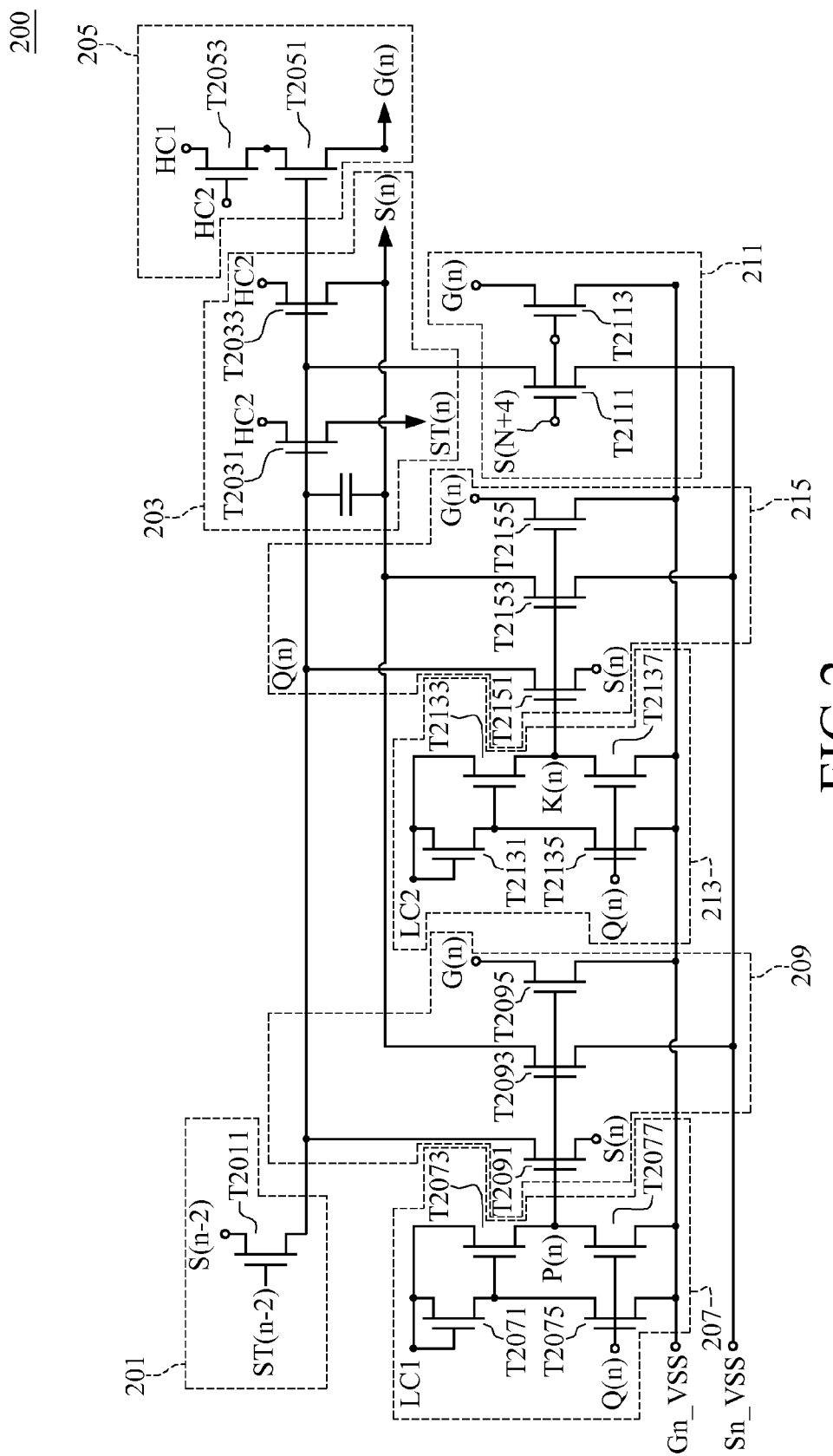
FIG. 2 is a schematic diagram illustrating a shift register circuit in accordance with one embodiment.

Please refer to FIG. 2, which is a schematic diagram illustrating a shift register circuit in accordance with one embodiment. The shift register circuit 200 comprises a pull up control circuit 201 for providing a pull up control signal Q(n); a first pull up circuit 203 for providing a sensor driving signal S(n) in accordance with the pull up control signal Q(n) and a second clock signal HC2; a second pull up circuit 205 for providing a gate driving signal G(n) in accordance with a first clock signal HC1, the pull up control signal Q(n) and a second clock signal HC2; a first pull down control circuit 207 configured to output a first pull down control signal P(n); a first pull down circuit 209 configured to pull down the pull up control signal Q(n), the sensor driving signal S(n) and the gate driving signal G(n) in accordance with the first pull down control signal P(n); a main pull down circuit 211 configured to pull down the pull up control signal Q(n) and the gate driving signal G(n).

The pull up control circuit 201 comprises a transistor T2011. The transistor T2011 comprises a control end, a first end, and a second end. The control end is configured to receive a carry signal ST(n−2) from a previous two stage shift register circuit. The first end is configured to receive a sensor driving signal S(n−2) from a previous two stage shift register circuit. The second end is configured to output a pull up control signal Q(n).

The first pull up circuit 203 comprises a transistor T2031 and a transistor T2033. The transistor T2033 comprises a control end for receiving the pull up control signal Q(n), a first end for receiving a second clock signal HC2, and a second end for outputting a sensor driving signal S(n) in accordance with the pull up control signal Q(n) and the second clock signal HC2. The transistor T2031 comprises a control end for receiving the pull up control signal Q(n), a first end for receiving a second clock signal HC2, and a second end for outputting a carry signal ST(n) in accordance with the pull up control signal Q(n) and the second clock signal HC2.

The second pull up circuit 205 comprises a first transistor T2051 and a second transistor T 2053. The first transistor T2051 comprises a control end, a first end and a second end, wherein the control end is configured to receive the pull up control signal Q(n) and the second end is configured to provide the gate driving signal G(n). The second transistor comprises a control end, a first end and a second end, wherein the control end is configured to receive the second clock signal HC2, the first end is configured to receive the first clock signal HC1, and the second end of the second transistor T2053 is coupled to the first end of the first transistor T 2051.

The first pull down control circuit 207 comprises a first transistor T2071, a second transistor T2073, a third transistor T2075 and a fourth transistor T2077. The first transistor T2071 comprises a first end, a second end and a control end, wherein the control end is coupled to the first end. The second transistor T2073 comprises a first end, a second end and a control end. The control end of the second transistor T2073 is coupled to the second end of the first transistor T2071 and is configured to receive a low frequency control signal LC1, and the first end of the second transistor T2073 is coupled to a first end of the first transistor T 2071. The third transistor T2075 and the fourth transistor T2077 respectively have a first end, a second end and a control end. The control end of the third transistor T 2075 and the control end of the fourth transistor T2077 are configured to receive the pull up control signal Q(n). The second end of the third transistor T2075 and the second end of the fourth transistor T2077 are configured to receive a first low voltage level signal Gn_Vss. The first end of the third transistor T2075 is coupled to the second end of the first transistor T 2071. The first end of the fourth transistor T2077 is coupled to the second end of the second transistor T 2073 and is configured to output the first pull down control signal P(n).

The first pull down circuit 209 comprises a first transistor T 2091, a second transistor T2093 and a third transistor T2095. The first transistor T2091 comprises a control end, a first end and a second end, and the control end is configured to receive the first pull down control signal P(n). The first end of the first transistor T2091 is coupled to the second end of the transistor T2011 of the pull up control circuit 201 and the second end of the first transistor T2091 is coupled to the control end of the transistor T2033 of the first pull up circuit 203. The second end of the second transistor T2093 is coupled to a second low voltage level signal Sn_Vss. The third transistor T2095 comprises a control end, a first end and a second end, wherein the control end is configured to receive a first pull down control signal P(n), the first end of the third transistor T2095 is coupled to the second end of the first transistor T2051 of the second pull up circuit 205 and is configured to pull down the gate driving signal, and the second end of the third transistor T2095 is coupled to a second low voltage level signal Sn_Vss.

To stabilize the output of the shift register circuit and reduce the threshold voltage shift of the transistors in the shift register circuit, in accordance with another embodiment of the present invention, a second pull down control circuit 213 and a second pull down circuit 215 are further added. The second pull down control circuit 213 is configured to output a second pull down control signal K(n) and the second pull down circuit 215 is configured to pull down the pull up control signal Q(n), the sensor driving signal S(n) and the gate driving signal G(n) in response to the second pull down control signal K(n). The pull down control circuit 207 is configured to output the first pull down control signal P(n) in response to a first low frequency control signal LC1, the second pull down control circuit 213 is configured to output the second pull down control signal K(n) in response to a second low frequency control signal LC2, and a phase of the first low frequency signal LC1 and a phase of the second low frequency signal LC2 are inverted. With the circuit configuration, the voltage stress of certain transistors could be reduced and thus the threshold voltage shift of the certain transistors could be reduced. For brevity, the operation of the second pull down control circuit 213 and the second pull down circuit 215 is omitted.

Figure 3:
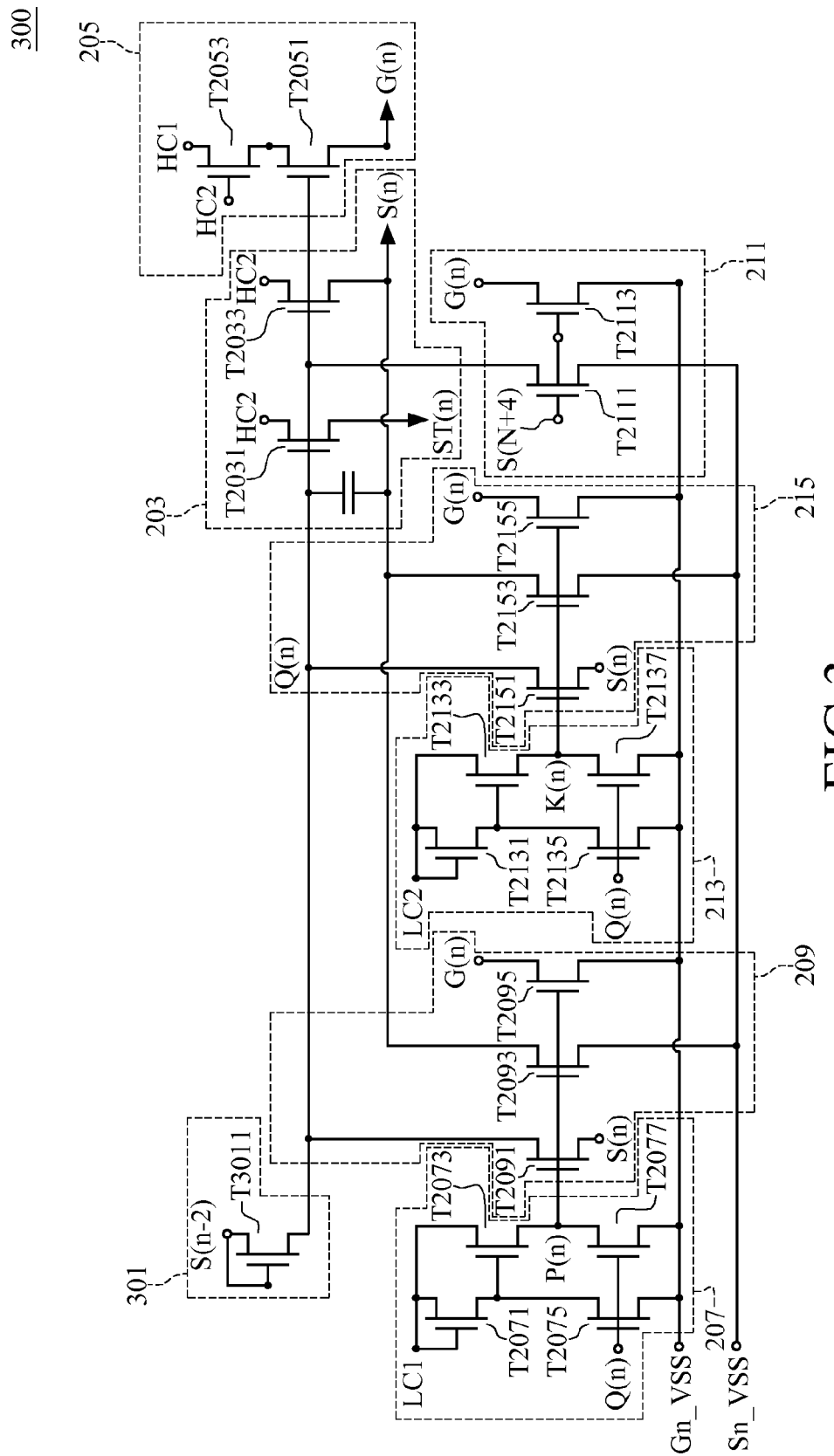
FIG. 3 is a schematic diagram illustrating a shift register circuit in accordance with another embodiment.

Please refer to both FIG. 2 and FIG. 3. FIG. 3 is a schematic diagram illustrating a shift register circuit in accordance with another embodiment. According to the embodiment of FIG. 2, the pull up control circuit 201 comprises a transistor T2011 and the gate and the source/drain of the transistor T2011 are both configured to receive a previous tow stage sensor driving signal S(n−2) or a previous two stage carry signal ST(n−2). According to the embodiment of FIG. 3, the pull up control circuit 301 comprises a transistor T3011, and the gate and the drain/source of the transistor T3011 is diode-connected.

Figure 4:
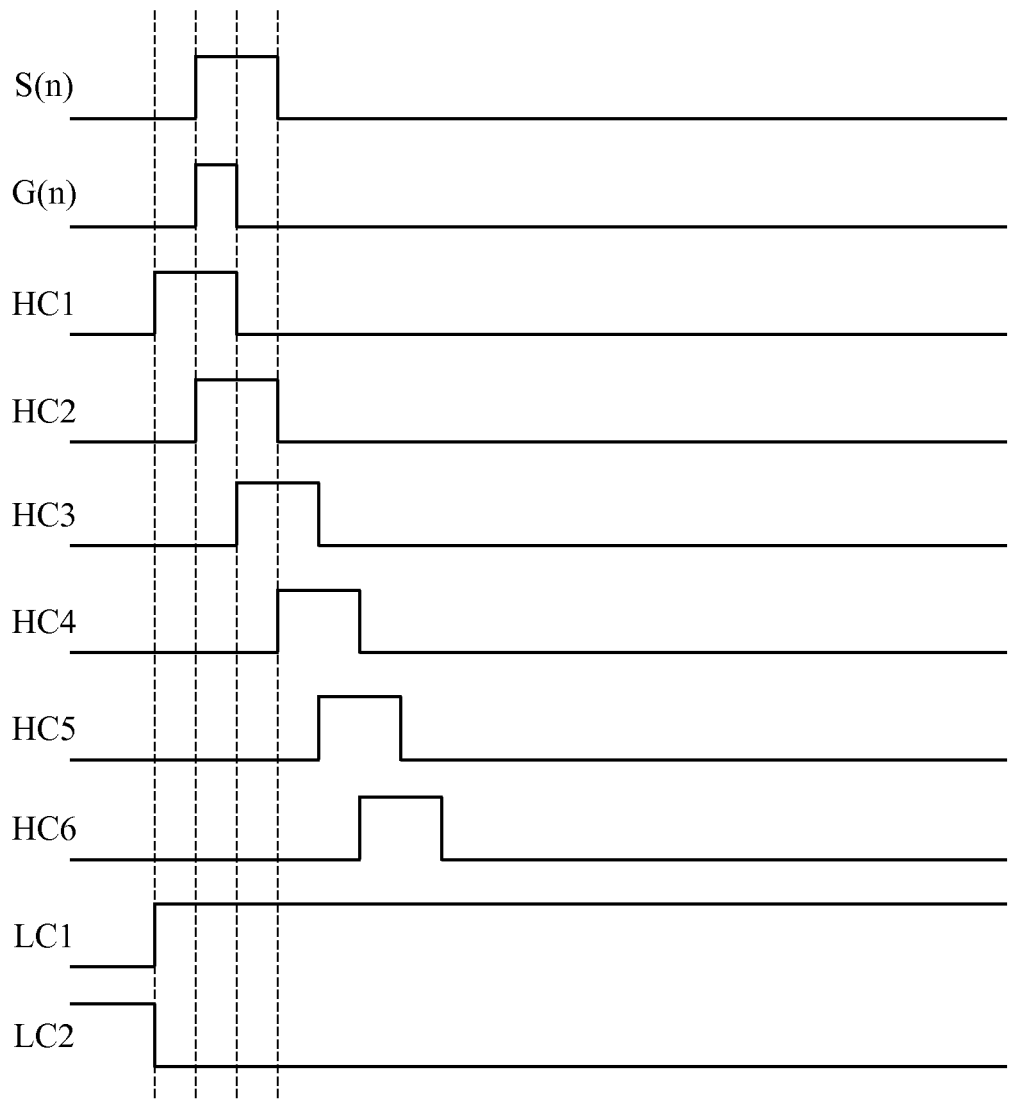
FIG. 4 is a graph of voltage versus time, illustrating a driving waveform in accordance with one embodiment.

Please refer to FIG. 4 which is a graph of voltage versus time, illustrating a driving waveform in accordance with one embodiment. According to the embodiment, the first clock signal HC1 and the second clock signal HC2 have a phase difference, and more particularly, the high voltage level of the first clock signal and the high voltage level of the second clock signal are 50% overlapped. Please refer to FIG. 2 and FIG. 4, the sensor driving signal S(n) outputted by the first pull up circuit 203 is at high voltage level when the second clock signal HC2 is at high voltage level and the pull up control signal Q(n) is at high voltage level. The gate driving signal G(n) outputted by the second pull up circuit 205 is at high voltage level when the first clock signal HC1 and the second clock signal HC2 are at high voltage level and the pull up control signal Q(n) is at high voltage level. According to one embodiment of the present invention, the high voltage level of the first clock signal HC1 and the high voltage level of the second clock signal HC2 are about 50% overlapped, and the pulse width of the sensor driving signal S(n) is twice as long as a pulse width of the gate driving signal G(n).

Figure 5:
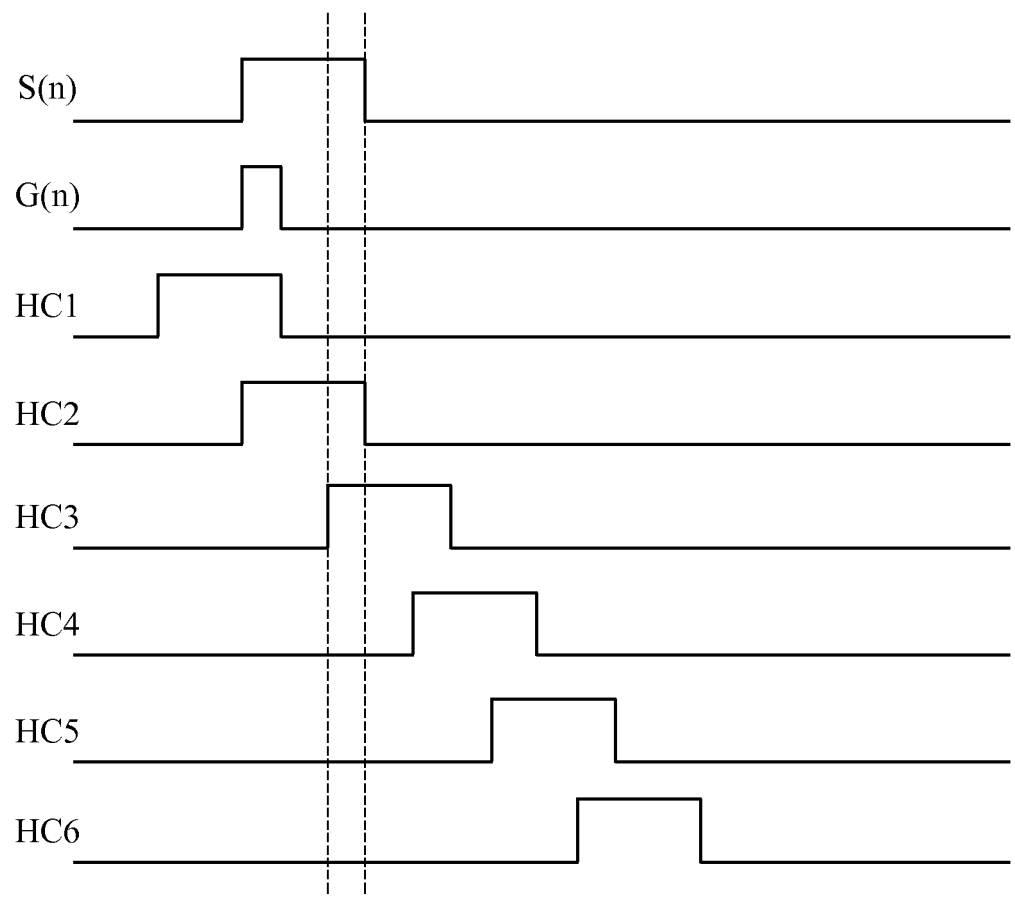
FIG. 5 is a graph of voltage versus time, illustrating a driving waveform in accordance with another embodiment.

Please refer to FIG. 1, FIG. 2 and FIG. 5. In accordance with the embodiment of the present invention, the high voltage level of the first clock signal HC1 and the high voltage level of the second clock signal HC2 are about 33% overlapped, and the pulse width of the sensor driving signal S(n) is three times as long as a pulse width of the gate driving signal G(n).

Figure 6:
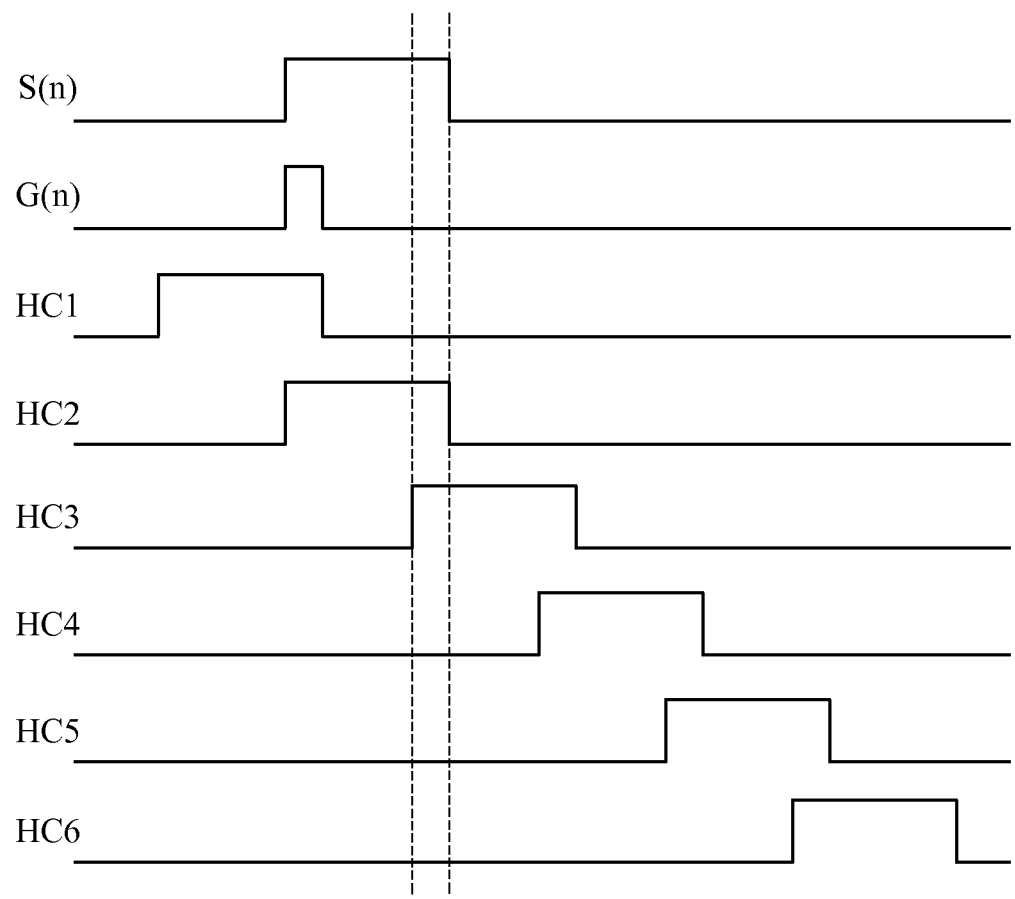
FIG. 6 is a graph of voltage versus time, illustrating a driving waveform in accordance with another embodiment.

Please refer to FIG. 1, FIG. 2 and FIG. 6. In accordance with the embodiment of the present invention, the high voltage level of the first clock signal HC1 and the high voltage level of the second clock signal HC2 are about 25% overlapped, and the pulse width of the sensor driving signal S(n) is
four times as long as a pulse width of the gate driving signal G(n).

According to the shift register circuit of the present application, the ratio of the pulse width of the sensor driving signal S(n) and the gate driving signal G(n) could be adjusted by adjusting the ratio of the pulse width of the first clock signal HC1 and the second clock signal HC2. Besides the ratios disclosed in the embodiments, other ratios are also viable. With the adjustment of pulse widths of the sensor driving signal S(n) and the gate driving signal G(n), the shift register circuit becomes more flexible and suitable for various applications.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A shift register circuit comprising:
   a pull up control circuit configured to provide a pull up control signal;
   a first pull up circuit configured to provide a sensor driving signal in response to the pull up control signal and a second clock signal;
   a second pull up circuit configured to provide a gate driving signal in response to a first clock signal, the pull up control signal and the second clock signal;
   a first pull down control circuit configured to output a first pull down control signal;
   a first pull down circuit configured to pull down the pull up control signal, the sensor driving signal and the gate driving signal in response to the first pull down control signal; and
   a main pull down circuit configured to pull down the pull up control signal and the gate driving signal;
   a second pull down control circuit configured to output a second pull down control signal; and
   a second pull down circuit configured to pull down the pull up control signal, the sensor driving signal and the gate driving signal in response to the second pull down control signal;
   wherein a high level of the first clock signal and a high level of the second clock signal have a overlapped ratio there between, and a pulse width of the sensor driving signal and a pulse width of the gate driving signal have a ratio there between.

2. The shift register circuit of claim 1, wherein the first pull down control circuit is configured to output the first pull down control signal in response to a first low frequency signal, the second pull down control circuit is configured to output the second pull down control signal in response to a second low frequency signal, and a phase of the first low frequency signal and a phase of the second low frequency signal are inverted.

3. The shift register circuit of claim 1, wherein the first clock signal and the second clock signal have a phase difference.

4. The shift register circuit of claim 1, wherein the high level of the first clock signal and the high level of the second clock signal are about 33% overlapped, and the pulse width of the sensor driving signal is three times as long as the pulse width of the gate driving signal.

5. The shift register circuit of claim 1, wherein the second pull up circuit comprises:
   a first transistor comprising:
   a control end for receiving the pull up control signal;
   a first end; and
   a second end for providing the gate driving signal; and
   a second transistor comprising:
   a control end for receiving the second clock signal;
   a first end for receiving the first clock signal; and
   a second end electrically coupled to the first end of the first transistor.

6. The shift register circuit of claim 5, wherein the high level of the first clock signal and the high level of the second clock signal are about 50% overlapped, and the pulse width of the sensor driving signal is twice as long as the pulse width of the gate driving signal.

7. The shift register circuit of claim 5, wherein the high level of the first clock signal and the high level of the second clock signal are about 33% overlapped, and the pulse width of the sensor driving signal is three times as long as the pulse width of the gate driving signal.

8. The shift register circuit of claim 5, wherein the high level of the first clock signal and the high level of the second clock signal are about 25% overlapped, and the pulse width of the sensor driving signal is four times as long as the pulse width of the gate driving signal.

9. A shift register circuit comprising:
   a pull up control circuit configured to provide a pull up control signal;
   a first pull up circuit configured to provide a sensor driving signal in response to the pull up control signal and a second clock signal;
   a second pull up circuit configured to provide a gate driving signal in response to a first clock signal, the pull up control signal and the second clock signal;
   a first pull down control circuit configured to output a first pull down control signal;
   a first pull down circuit configured to pull down the pull up control signal, the sensor driving signal and the gate driving signal in response to the first pull down control signal; and
   a main pull down circuit configured to pull down the pull up control signal and the gate driving signal;
   wherein a high level of the first clock signal and a high level of the second clock signal are about 50% overlapped, and a pulse width of the sensor driving signal is twice as long as a pulse width of the gate driving signal.

10. A shift register circuit comprising:
    a pull up control circuit configured to provide a pull up control signal;
    a first pull up circuit configured to provide a sensor driving signal in response to the pull up control signal and a second clock signal;
    a second pull up circuit configured to provide a gate driving signal in response to a first clock signal, the pull up control signal and the second clock signal;
    a first pull down control circuit configured to output a first pull down control signal;
    a first pull down circuit configured to pull down the pull up control signal, the sensor driving signal and the gate driving signal in response to the first pull down control signal; and
    a main pull down circuit configured to pull down the pull up control signal and the gate driving signal;
    wherein a high level of the first clock signal and a high level of the second clock signal are about 25% overlapped, and a pulse width of the sensor driving signal is four times a pulse width of the gate driving signal.

* * * * *